United States Patent
Vassiliev et al.

(10) Patent No.: US 6,355,581 B1
(45) Date of Patent: Mar. 12, 2002

(54) GAS-PHASE ADDITIVES FOR AN ENHANCEMENT OF LATERAL ETCH COMPONENT DURING HIGH DENSITY PLASMA FILM DEPOSITION TO IMPROVE FILM GAP-FILL CAPABILITY

(75) Inventors: Vladislav Vassiliev; John Leonard Sudijono; Yelehanka Ramachandramurthy Pradeep; Jie Yu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/511,276

(22) Filed: Feb. 23, 2000

(51) Int. Cl.$^7$ .............................................. H01L 21/316
(52) U.S. Cl. ...................... 438/789; 438/758; 438/766; 438/774; 438/787; 438/788
(58) Field of Search .................................. 438/758, 766, 438/774, 787, 788, 789

(56) References Cited

U.S. PATENT DOCUMENTS

| | | | |
|---|---|---|---|
| 5,270,264 A | 12/1993 | Andideh et al. | 437/288 |
| 5,728,621 A | 3/1998 | Zheng et al. | 438/427 |
| 5,776,834 A | 7/1998 | Avanzino et al. | 438/692 |
| 5,814,564 A | 9/1998 | Yao et al. | 438/723 |
| 5,827,785 A | * 10/1998 | Bhan et al. | 438/784 |
| 5,872,058 A | 2/1999 | Van Cleemput et al. | 438/692 |
| 5,908,672 A | 6/1999 | Ryu et al. | 427/574 |
| 5,913,140 A | 6/1999 | Roche et al. | 438/624 |
| 5,915,190 A | 6/1999 | Pirkle | 438/424 |
| 5,935,340 A | * 8/1999 | Xia et al. | 134/1.1 |
| 5,946,592 A | 8/1999 | Lin | 438/633 |
| 5,968,610 A | 10/1999 | Liu et al. | 427/579 |
| 5,976,993 A | 11/1999 | Ravi et al. | 438/788 |
| 6,001,746 A | 12/1999 | Tsai et al. | 438/788 |
| 6,110,826 A | * 8/2000 | Lou et al. | 438/674 |

OTHER PUBLICATIONS

J. Yota et al., "Extendibility of ICP High–Density Plasma CVD for Use as Intermetal Dielectric and Passivation Layers for 0.18 $\mu$m Technology", Proceedings of Fifth Dielectrics for ULSI Multilevel Int. Conf., (DUMIC), 1999, pp. 71–82.

R. Conti et al., "Processing Methods to Fill High Aspect Ratio Gaps without Premature Constriction", Proceedings of Fifth Dielectrics for ULSI Multilevel Int. Conf., (DUMIC), 1999, pp. 201–209.

V. Vassiliev, "Properties and Gap–Fill Capability of HDP–PSG Films for 0.18 $\mu$m Device Applications and Beyond", Proceedings of Fifth Dielectrics for ULSI Multilevel Int. Conf. (DUMIC), 1999, pp. 235–244.

* cited by examiner

Primary Examiner—Charles Bowers
Assistant Examiner—Lisa Kilday
(74) Attorney, Agent, or Firm—George O. Saile; Rosemary L. S. Pik

(57) ABSTRACT

A method for fabricating a silicon oxide and silicon glass layers at low temperature using High Density Plasma CVD with silane or inorganic or organic silane derivatives as a source of silicon, inorganic compounds containing boron, phosphorus, and fluorine as a doping compounds, oxygen, and gas additives is described. RF plasma with certain plasma density is maintained throughout the entire deposition step in reactor chamber. Key feature of the invention's process is a silicon source to gas additive mole ratio, which is maintained depending on the used compound and deposition process conditions. Inorganic halide-containing compounds are used as gas additives. This feature provides the reaction conditions for the proper reaction performance that allows a deposition of a film with. good film integrity and void-free gap-fill within the steps of device structures.

17 Claims, 5 Drawing Sheets

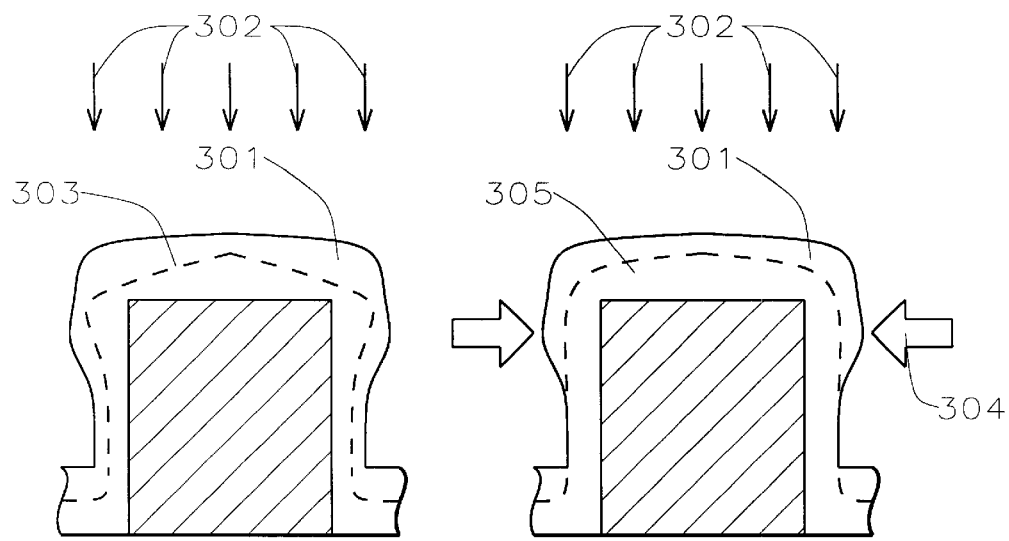
FIG. 6A
Prior Art
FIG. 6B
Prior Art
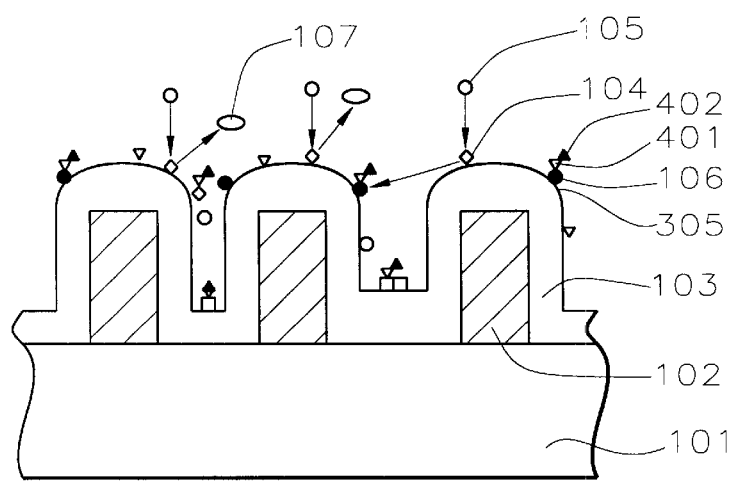
FIG. 7

GAS-PHASE ADDITIVES FOR AN ENHANCEMENT OF LATERAL ETCH COMPONENT DURING HIGH DENSITY PLASMA FILM DEPOSITION TO IMPROVE FILM GAP-FILL CAPABILITY

BACKGROUND OF INVENTION

1. Field of the Invention

This invention relates generally to fabrication of semiconductor devices and more particularly to the fabrication of silicon oxide and silicon glass films by using a High Density Plasma Chemical Vapor Deposition (HDP-CVD) technique with gas mixtures containing silane or its derivatives, necessary doping precursors, oxygen, and special gas additives.

2. Description of the Prior Art

In the fabrication of devices such as semiconductor devices, a variety of material layers are sequentially formed and processed on the substrate. For the purpose of this disclosure, the substrate includes a bulk material such as semiconductor, e.g., silicon, body, and if present, various regions of materials such as dielectric materials, conducting materials, metallic materials, and/or semiconductor materials. One of the material regions utilized in this fabrication procedure includes a silicon oxide, i.e., a material represented by the formula $SiO_n$, where n=~2, or doped silicon oxide films, containing an additional doping element such as boron, phosphorus, fluorine, carbon, and their mixtures with total dopant content depending on the purpose of film application in the device. Below the common term "silicon oxide film" is used to characterize both silicon dioxide film and silicon oxide based glass films. Silicon oxide regions are utilized as insulating/passivating layers, as an electrical insulation between conducting layers, e.g., polysilicon or metal layers. Films of undoped silicon oxide are used also as a liner or as a cap layer either under or on the doped silicon oxide layers, respectively, to limit unacceptable dopant migration during subsequent processing.

Among other techniques used in semiconductor processing, silicon oxide films are deposited using Plasma Enhanced Chemical Vapor Deposition (PECVD), and High Density Plasma Chemical Vapor Deposition (HDP-CVD) techniques. The last technique assumes simultaneous deposition and sputtering of depositing films in order to improve gap-fill capability, as shown schematically in FIG. 1. FIG. 1 shows steps 102 formed on a semiconductor substrate 101. The silicon oxide film 103 is deposited over the steps 102. $SiO_2$ species are shown 104 on the surface of the film. Ionized Ar molecules 105 bombard the surface of the film resulting in sputtered and redeposited $SiO_2$ 106 and vaporized $SiO_2$ species 107.

The method of chemical vapor deposition of silicon oxide and doped silicon glass films at High Density Plasma conditions (HDP-CVD) with silane-oxygen based gas mixtures is used in semiconductor manufacturing mostly for sub-quarter micron Ultra Large Scale Integrated (ULSI) circuit device applications. This method is used for deposition of silicon oxide, or frequently known as undoped silicon glass (USG), phosphosilicate glass (PSG), and fluorosilicate glass (FSG). In the case of doped films, the dopant precursor, such as phosphine $PH_3$, for example is added to the silane-oxygen mixture. Also, organic/inorganic silane derivatives, such as tetrafluorosilane $SiF_4$ or difluorosilane $SiH_2F_2$, are used either alone or in a mixture with silane.

The problem of film integrity and void formation (below the common term "voids" is used for both types of film structure imperfection) in different types of as-deposited HDP-CVD films have been found and analyzed recently, see for instance: [Ref.1]: R. Conti, L. Economikos, G. D. Parasouliotis, et al. "Processing Methods to Fill High Aspect Ratio Gaps Without Premature Construction," *Proceedings of Fifth Dielectrics for ULSI Multilevel Int.Conf.* (DUMIC), (1999), p. 201 and [Ref.2]: J. Yota, A. Joshi, C. Nguyen et al. "Extendibility of ICP High-Density Plasma CVD for Use as Intermetal dielectric and Passivation Layers for 0.18 um Technology." *Proceedings of Fifth Dielectrics for ULSI Multilevel Int.Conf.* (DUMIC), (1999), p.71.

The reason for void formation under HDP-CVD conditions is normally explained as a result of redeposition of the film on the nearest surfaces caused by etch/sputtering of the film with argon bombardment from the top edges of structure steps, as shown in FIG. 1. This effect is shown in progress in FIG. 2. Continuous deposition with etch/sputtering causes the formation of film on the steps 102 (shown in FIG. 2A), followed by void nucleation and formation 108 at smallest spacings, as shown in FIG. 2B and FIG. 2C, followed by void formation at the certain critical spacing ($G_{critical}$) and critical aspect ratios ($AR_{critical}$) 109. At the same time, a void-free film forms at a certain gap spacing, which is larger than critical, and aspect ratio, which is less than critical, as shown in FIG. 2B, 110, that eventually leads to the void-free gap-fill when full film thickness is achieved, as shown in FIG. 2C.

Detailed analysis of HDP-CVD gap-fill capability for an example of structures with vertical side wall steps, mostly desired for ULSI applications, has been performed in [Ref.3]: V. Vassiliev, C. Lin, D. Fung et al. "Properties and Gap fill Capability of HDP-PSG Films for 0.18 um Device Applications and Beyond," *Proceedings of Fifth Dielectrics for ULSI Multilevel Int.Conf.* (DUMIC), (1999), p.235, for the above mentioned film types and two main ranges of the HDP-CVD deposition temperature, namely, less than about 400° C. and higher than about 500° C. These summarized data are presented in FIG. 3. HDP-CVD gap-fill capability is shown for rectangular step shape with vertical side walls at low temperature (<400° C.) (line 31), rectangular step shape with vertical side walls at high temperature (>500° C.) (line 33), and tapered gap space with round step corners (line 35).

Thus, HDP-CVD gap-fill capability limitations for the commonly used deposition conditions can be quantitatively described by simple equations:

$$AR_{critical} \leq k \times G_{critical},$$

where the values of coefficient k have been found to be about 13.3 $\mu m^{-1}$ and 20.1 $\mu m^{-1}$ for high and low temperature processes, respectively. To reduce void formation effects in HDP-CVD, e.g. to enhance gap-fill capability of HDP-CVD technique, the following approaches have been considered recently:

a) a decrease of the anisotropic etch (sputtering) component to deposition ratio (below "E/D ratio") and decrease of process pressure. This helps to reduce an impact of film sputtering and, therefore, re-deposition. However, these measures cause an undesirable decrease of HDP-CVD process productivity as well as a necessity to enhance pump productivity.

b) structure rounding, as described in [Ref.3], and as shown schematically in FIG. 4B. In fact, such rounding allows a much better HDP-CVD gap-fill capability using the same process conditions, including pressure, power, etch to deposition ratio, as shown in FIG. 3. However, this approach is not applicable for all ULSI device structure elements.

Voids in device structures are not acceptable because of a worsening of device reliability. Therefore, it is very desirable to produce a good HDP-CVD film integrity and gap-fill capability. The prior art processes do not provide a silicon oxide layer that can satisfactorily fill gaps between the increasingly tight step features of new ULSI semiconductor devices without forming voids in between the conductor lines.

The importance of overcoming the various deficiencies noted above is evidenced by the extensive technological development directed to the subject, as documented by the relevant patent and technical literature. The closest and apparently more relevant technical developments in the patent literature can be gleaned by considering the following. U.S. Pat. No. 5,915,190 to Pirkle shows a PECVD thin protection layer and a high RF-power sputter/CVD technique. U.S. Pat. No. 5,814,564 to Yao et al teaches a HDP-CVD process following by spin-on-glass (SOG) deposition and a 6-step etch process to planarize the two layers. U.S. Pat. No. 5,964,592 to Lin teaches forming 3 HDP-CVD layers then a CVD layer. U.S. Pat. No. 5,728,621 to Zheng et al teaches HDP-CVD then SOG. U.S. Pat. Nos. 5,827,785 to Bhan et al and 5,908,672 to Ryu et al show FSG processes. U.S. Pat. No. 5,872,058 to Van Cleemput et al shows a high aspect ratio HDP-CVD fill process. U.S. Pat. Nos. 5,913,140 to Roche et al and 5,776,834 to Avanzino et al show HDP-CVD processes with sputter steps. U.S. Pat. No. 5,968,610 to Liu et al shows a multi-step HDP-CVD process. U.S. Pat. No. 5,976,993 to Ravi et al teaches an inductively-coupled plasma process with sputtering. U.S. Pat. No. 6,001,746 to Tsai et al shows a FSG HDP-CVD process. U.S. Pat. No. 5,270,264 to Andideh et al shows HDP-CVD with a sputter etchback step.

SUMMARY OF THE INVENTION

It is an object of the present invention to provide a method for fabricating a silicon oxide layer that provides films with good film integrity without voids in the film within steps of device structures using a HDP-CVD deposition process with silane or silane derivatives and oxygen mixtures, and gas additives.

It is an object of the present invention to provide a method for fabricating a silicon oxide layer over a stepped substrate surface using "HDP-CVD with additives" process that produces good integrity of film along the device steps and void-free structures. The invention "HDP-CVD with additives" process and preferred Invention's process conditions are shown below in Table 1. The most critical parameter in the invention are silicon source to additive mole ratio, sputtering to deposition ratio, and total pressure.

The invention has the following advantages: good gap-fill capability at relatively high process pressures and etch to deposition ratios, and relatively high deposition rate and process productivity. Besides, it is simply realized and there is no need to change chamber design.

The present invention achieves these benefits in the context of known process technology. However, a further understanding of the nature and advantages of the present invention may be realized by the reference to the latter portions of the specification and attached drawings.

TABLE 1

| Process parameter | Estimated range of parameters for Invention's HDP-CVD with additives | An example of preferred set of parameters |
| --- | --- | --- |
| Wafer temperature (° C.) | 250–650 | 400–650 |
| Pressure (millitorr) | 0.5–10 | 1–5 |
| Plasma frequency (KHz) | 300–600 | 400–450 |
| Plasma density (ion/cm$^3$) | $1 \times E11$–$1 \times E13$ | $1 \times E11$–$1 \times E12$ |
| Anisotropic etch to deposition (E/D) ratio | 0.03–0.3 | 0.05–0.15 |
| Silicon source | Silane Inorganic silane derivatives Organic silane derivatives | Silane Methylsilanes |
| Silicon source flow (sccm) | 50–500 | 100–200 |
| Oxygen flow (sccm) | 100–400 | 250–350 |
| Dopant compounds | Diborane and its derivatives Phosphine and its derivatrives Fluorinated silane derivatives | Diborane and its derivatives Phosphine and its derivatrives Fluorinated silane derivatives |
| Dopant gas flows | Must be chosen based on desirable dopant concentration | Must be chosen based on desirable dopant concentration |
| Carrier gas | Ar, He | Ar, He |
| Carrier gas flow (sccm) | 20–400 | 50–100 |
| Gas additives: | | |
| fluorine compounds | $SF_6$, HF, $F_2$ | $SF_6$, HF |
| chlorine compounds | $ClF_3$, HCl, $Cl_2$, $SiCl_4$ | $ClF_3$, $Cl_2$ |
| bromine compounds | HBr, $Br_2$ | HBr |
| Silicon/additive source mole ratio: | 0.5–50 | 3–20 |

BRIEF DESCRIPTION OF THE DRAWINGS

The features and advantages of a semiconductor device according to the present invention and further details of a process of fabricating such as a semiconductor device in accordance with the present invention will be more clearly understood from the following description taken in conjunction with the accompanying drawings in which like reference numerals designate similar or corresponding elements and regions and in which:

FIGS. 6A and 6B are cross-sectional schemes illustrating non-conformal film growth on device steps during plasma-enhanced CVD with anisotropic etch component and with combined anisotropic and isotropic etch components.

FIG. 7 is a simplified cross-sectional scheme of gap-fill capability improvement in accordance with the present invention.

DETAILED DESCRIPTION OF THE PREFERRED EMBODIMENTS

The present invention will be described in detail with reference to the accompanying drawings. In the following description numerous specific details are set forth such as flow rates, pressure settings, thickness, etc., in order to provide a more thorough understanding of the present invention. It will be obvious, however, to one skilled in the art that the present invention may be practiced without these details. In other instances, well known processes have not been described in detail in order to not unnecessarily obscure the present invention. Also, the flow rates in the specification can be scaled up or down keeping the same molar % or ratios to accommodate different sized reactors as is known to those skilled in the art.

A. Observation of Voids in HDP-CVD Films

Figure 2A:
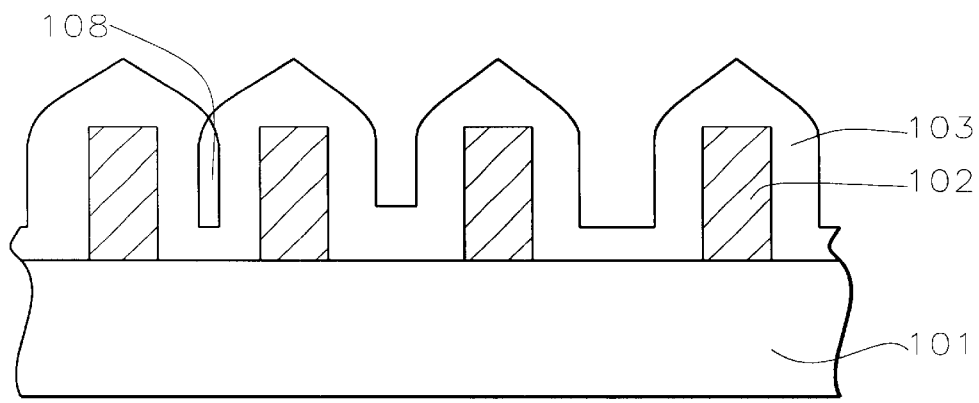
FIGS. 2A, 2B and 2C are cross-sectional views illustrating a void formation process at HDP-CVD conditions.
Figure 2B:
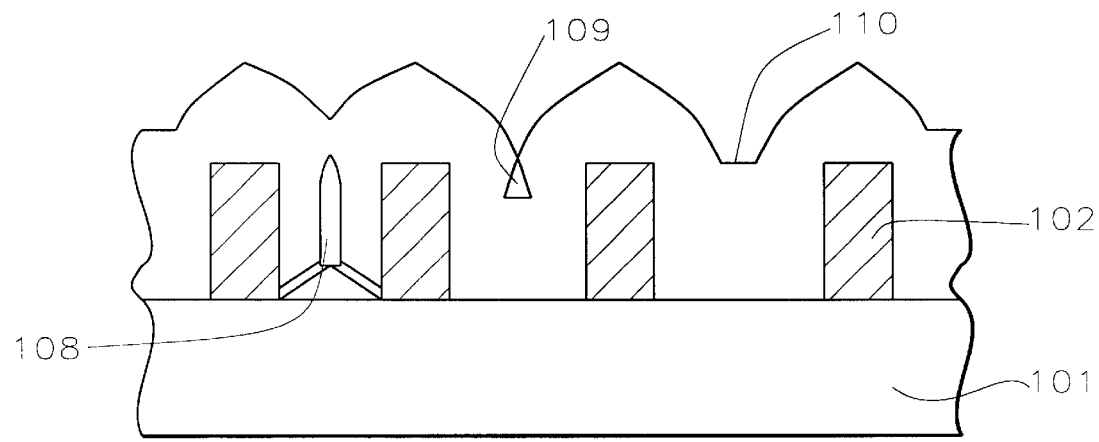
Figure 2C:
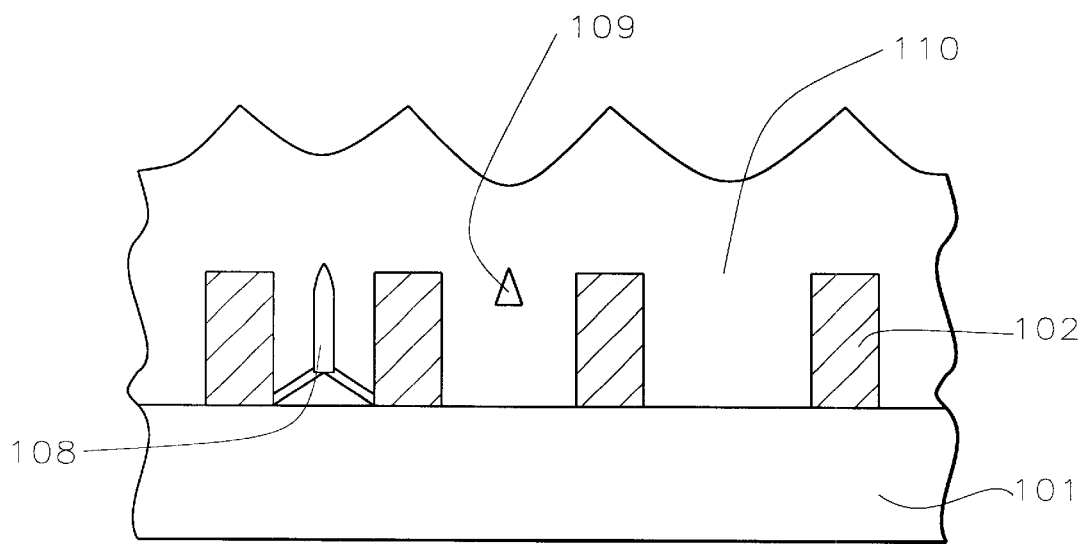
Figure 3:
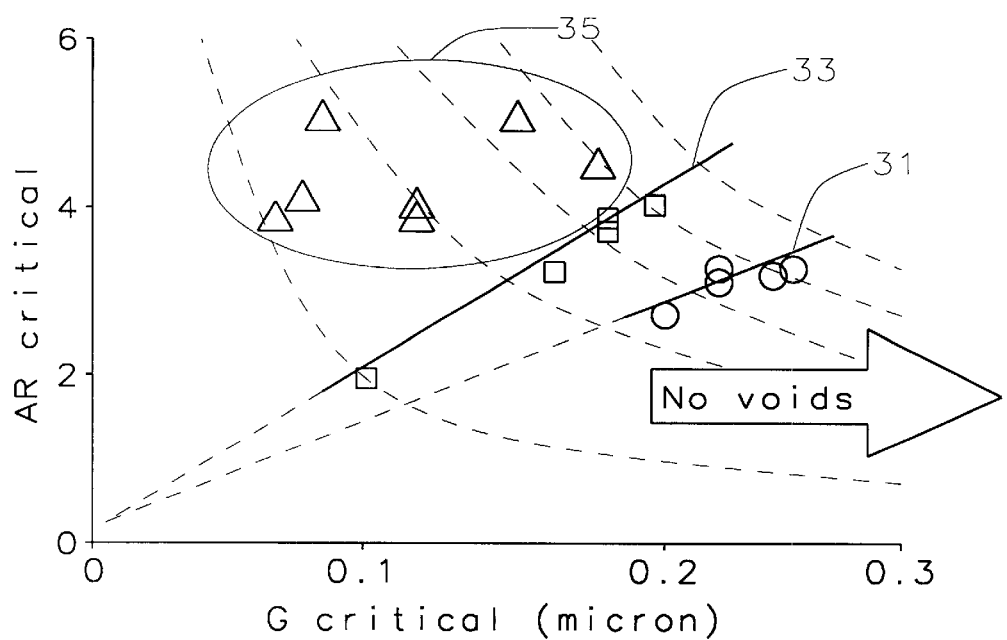
FIG. 3 is a graph showing summarized HDP-CVD gap-fill capability for different deposition conditions and different types of dielectric films.
Figure 4A:
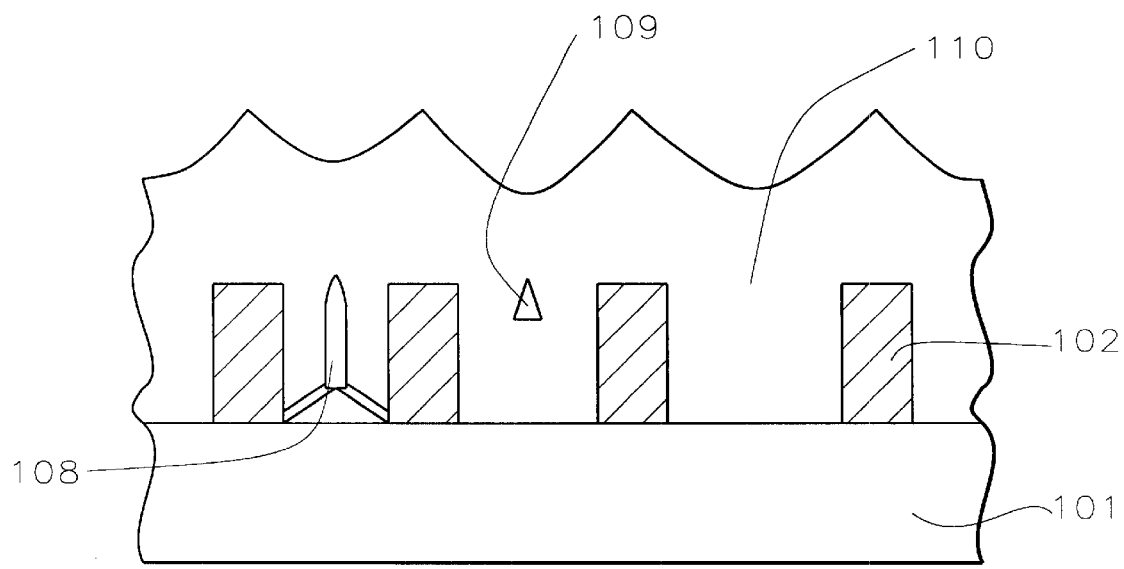
FIGS. 4A and 4B are cross-sectional views of HDP-CVD film deposition for rectangular and tapered shape of device structures, respectively.
Figure 4B:
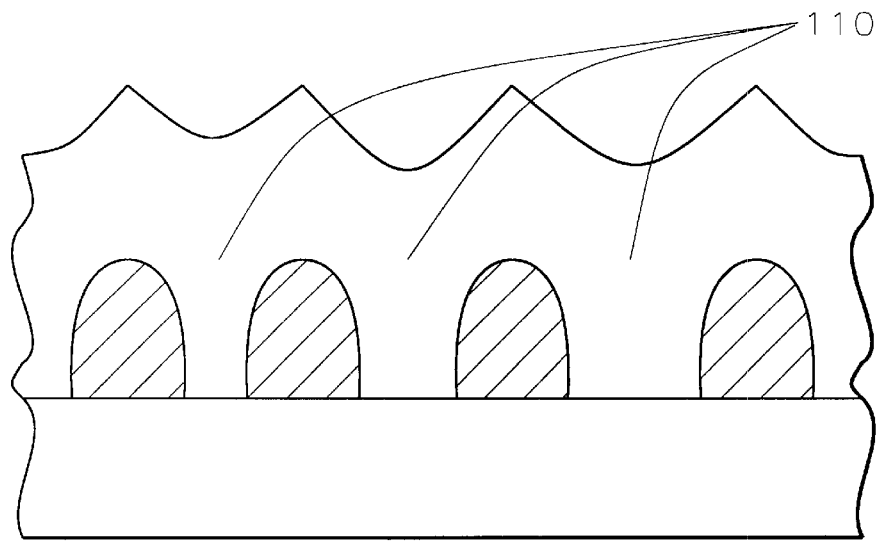

Normally, voids can be observed using cross sectional scanning electron microscopy analysis of device structures. Film imperfection, or voids, in different types of HDP-CVD films have been found to form in the bottom corners of as-deposited films, and in the center of the space between the two nearest lines of a device, as shown in FIG. 2A–FIG. 2C. The shape of voids is dependent on the film type and gap geometry, namely space between lines (G) and aspect ratios (AR). Aspect ratio is a certain characteristic which defines structure and it can be calculated by dividing the gap height by the gap space.

B. Problems of Conventional HDP-CVD Processes

The inventors have determined that previous silicon oxide deposition techniques do not meet the changing requirements of new denser products. It is to be understood in this regard that no portion of the discussion below is admitted to be prior art as to the present invention. Rather, this highly simplified discussion is an effort to provide an improved understanding of the problems that are overcome by the invention.

The general characteristics of the prior art approach are listed in the Table 2 below.

The following conclusions can be drawn from the comparison of data in Table 2: advantages of the prior art HDP-CVD process cannot be used because of bad film gap-fill capability. Advantages of this method and more advantages of film gap-fill capability can be achieved using the invention's "NHDP-CVD with additives" process.

TABLE 2

| HDP-CVD method | Advantage | Disadvantage |
| --- | --- | --- |
| HDP-CVD prior art | 1. Good gap-fill capability at high spacing and small aspects ratios.<br>2. Relatively high deposition rate | 1. Gap-fill capability becomes worse with tightening of gap spacing and with the increase of aspect ratios. It needs process pressure and E/D ratio to be decreased.<br>2. Decrease the deposition rate and process productivity with the decrease of pressure and E/D ratio.<br>3. Non-acceptable voiding in device structures causes reliability issues |
| Invention: HDP-CVD additives process | 1. Good gap-fill capability at small spacing and high aspect ratio at relatively high deposition pressures and E/D ratios | |

TABLE 2-continued

| HDP-CVD method | Advantage | Disadvantage |
| --- | --- | --- |
| | 2. Relatively high deposition rate and productivity<br>3. Simply realized | |

To clarify prior art HDP-CVD process features, an analysis of major deposition problems is presented below in detail using a silane $SiH_4$, mostly used for HDP-CVD processes at present, as a typical silicon source representative of the present invention.

It is known that the chemical reaction of silane with oxygen can be realized in a wide range of temperatures (from room temperatures and above) to produce silicon oxide as either a powder or a film. This reaction is known to have a chain reaction mechanism, as simply presented below in scheme (1), with a formation of highly active intermediate products (IMP)-radicals followed by formation of a $SiO_2$ species in the gas phase. After that, gas-phase species diffuse to the surface followed by their adsorption and reaction to form a solid state film, as shown below:

$$\text{silane+oxygen} \rightarrow IMP_1 \rightarrow \ldots \rightarrow IMPN \rightarrow SiO_2 \text{ (film)} \tag{1}$$

This reaction is considered as a gas phase limited reaction, i.e. the relatively slowest stage of chemical reaction is a formation of intermediate compounds IMP. It is also known that plasma excitation of reaction mixtures also causes a formation of highly active intermediate radicals, especially at conditions used in a High Density Plasma deposition method. Thus, HDP-CVD deposition with silane or silane derivatives and oxygen generally goes in accordance with radical mechanisms.

Figure 5A:
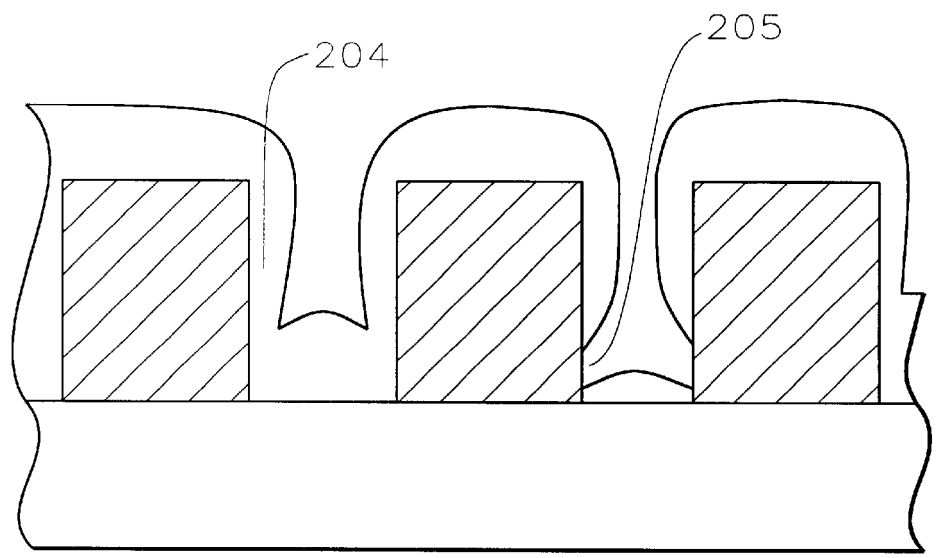
FIGS. 5A and 5B are cross-sectional views of non-conformal step coverage at a conventional silane-oxygen CVD process and plasma-enhanced CVD process, respectively.

It is also known that a chemical vapor deposition technique with silane-oxygen mixtures usually provides very non-conformal step coverage of deposited film on device steps 204, which leads to void formation or imperfection of film integrity in the bottom corners of device elements 205, as shown in FIG. 5A. This effect becomes dramatically stronger with a tightening of gap spacing between device elements and, therefore, with the increase of aspect ratios. This effect is also stronger with an increase of effective reaction constant ($K_{eff}$), i.e. deposition rate. (Effective reaction constant is determined as a ratio of the deposition rate value and a concentration of silicon compound in the gas phase. In fact, for the most studied CVD deposition reactions, a reaction rate has a first order with respect to the silicon precursors. In the case of more complicated gas mixtures containing, for example, dopant compounds, their concentration might not be taken into account due to their very little impact on the deposition rate of the whole process).

Figure 5B:
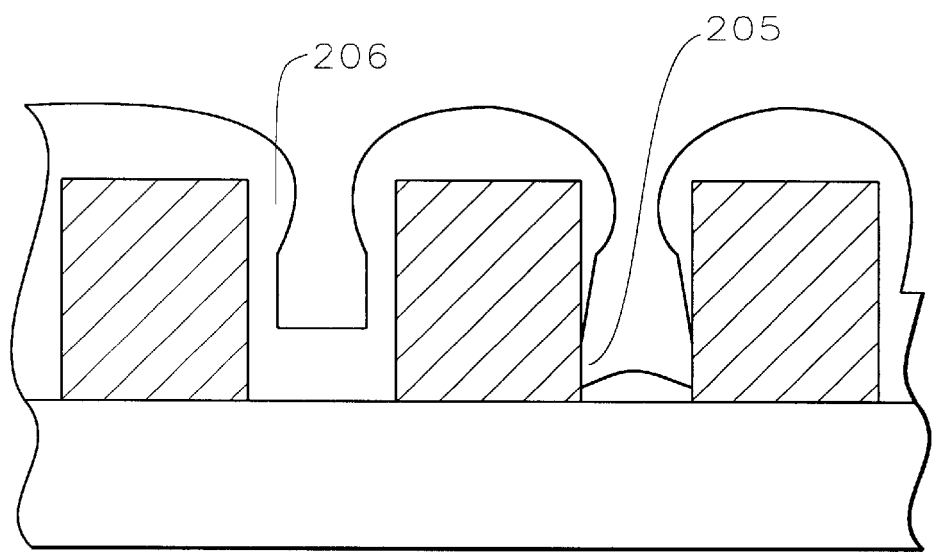

Plasma Enhanced CVD (PECVD) using oxidation of silane or its derivatives with oxygen creates a specific "bread-loafing" profile of deposited film, as shown by 206 in FIG. 5B. This causes voids at spacing lower than about 0.6 micron and AR higher than about 0.6.

Figure 1:
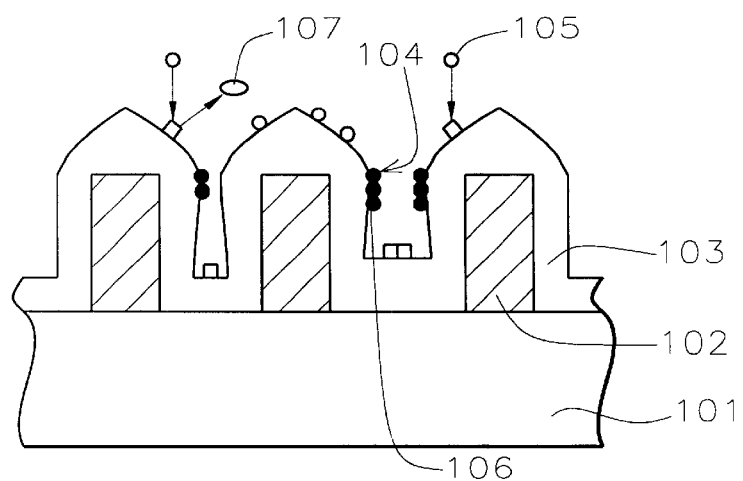
FIG. 1 is a simplified cross-sectional scheme of a conventional HDP-CVD film deposition.

HDP-CVD method with simultaneous deposition and in-situ etch/sputtering of growing film allows an improvement of film growth, making it to be very specific, as shown in FIG. 1. In fact, growing HDP-CVD film 103 on the steps 102 of a device on the substrate surface 101 has a specific shape due to the partial sputtering of the growing silicon oxide species 104 by inert gas radicals 105. Sputtered species 104 can further either re-deposit on the nearest surfaces of the neighbor step to form re-deposited film 106, or evaporate 107 and further to be pumped out of the reactor. Eventually, simultaneous etch/sputtering allows improvement of growing film on the top of structures and, therefore, an improvement of the HDP-CVD film gap-fill.

However, HDP-CVD technique has also gap-fill limitations, as has been shown above. This is because the etch/sputtering cannot fully compensate for the strongly non-conformal profile of the growing film. As a result, voids 108 and 109 are forming during HDP-CVD film deposition, as shown in FIG. 2A–2C. Thus, an improvement of the step coverage of the growing film itself and, therefore, during HDP-CVD film deposition, will lead to the improvement of HDP-CVD gap-fill capability without turning major process parameters like etch to deposition ratio, pressure, power density, etc.

Invention's HDP-CVD with Additives Process

In summary: the advantages of a standard prior art HDP-CVD processes cannot be used because of bad gap-fill capability with the tightening of device geometry and because of worsening of deposition rate with the decrease of process pressure and etch to deposition ratios. The invention's "HDP-CVD with additives" process covers advantages of prior art methods and provides further advantages of film properties.

A. Advantages of the Invention's HDP-CVD with Additives Process

The invention has the following advantages: good gap-fill capability at relatively high process pressures and etch to deposition ratios, relatively high deposition rate and process productivity. Besides, it is simply realized and there is no need to change chamber design.

The invention's process can be performed in any High Density Plasma reactors providing necessary wafer heating and equipped with necessary RF-power assemblies, gas supply system and vacuum pumping system without any modification of reaction chamber design. For instance, it can be realized in the "Ultima" HDP-CVD reactor made by Applied Materials, Inc., or in "SPEED" HDP-CVD reactor created by Novellus's Inc., etc.

B. Application of Method of Invention's HDP-CVD with Additives Process

The Invention's HDP-CVD with additives process can be used to deposit the following types of dielectric layers: undoped silicon glass (USG), including liner and cap layers; borosilicate glass (BSG), phosphosilicate glass (PSG), borophosphosilicate glass (BPSG), fluorosilicate glass (FSG), and carbon-contained silicon oxide films (CSG).

C. Detailed Description of Invention's HDP-CVD with Additives

This invention's HDP-CVD with additives process provides good gap-fill capability at relatively high process pressures and etch to deposition ratios and relatively high deposition rate and process productivity. Detailed parameters of the invention's HDP-CVD with additives process are shown in Table 1 shown above in the Summary section. The process parameters presented in Table 1 can be used for deposition of the silicon oxide that can be doped with boron, phosphorus and fluorine (the borosilicate, phosphosilicate, fluorosilicate and carbon-contained silicon glass films) using the Invention's HDP-CVD with additives deposition process with boron, phosphorus, and fluorinated silane derivatives, for example, such as diborane, phosphine, difluorosilane, tetrafluorosilane, etc. In this case, particular dopant precursor flows and ratios of boron, phosphorus, and fluorinated silane derivatives to silicon source flow are chosen based on the required concentration of boron, phosphorus, or fluorine in the glass. In the case of carbon-contained films, organic silane derivatives, such as methylsilanes, are used as a source of silicon.

The most critical parameters in the invention are silicon source to additive mole ratio, etch to deposition ratio, and process pressure. The following knowledge is used for an explanation of the possible reason for bad gap-fill in prior art HDP-CVD processes. Also, the reason for proposed improvement can be understood clearly from the following explanation of film growth on the device steps, as shown schematically below.

As it was mentioned above, profile of any HDP-CVD growing film without sputtering has a bread-loaf shape, i.e. it is non-conformal, as shown by 301 in FIG. 6A. Use of argon or helium sputtering 302 in conventional HDP-CVD, or in other words, introducing normal to the substrate surface an anisotropic etch component during deposition, creates a specific triangle profile 303, as shown in FIG. 6A. This profile for small device gaps means formation of a re-entrant growing film boundary and, eventually, voiding as shown in progress in FIG. 2. Used as an addition to anisotropic, a lateral (or isotropic) etch component during deposition, as shown by 304 in FIG. 6B, allows an improvement of the growing film profile 305. In fact, lateral etch is known to provide similar etch rate for isolated structures, and it is expected to provide higher etch rate on the top of device structures and lower etch rate in the bottom of small gaps due to the diffusion limitations. It provides the removal of re-sputtering material species as well, which are re-deposited closer to the step top. Thus, a combination of lateral etch component and sputtering component allows the management of the growing film profile and, eventually, the elimination of re-entrant profiles, as shown in FIG. 6B, i.e. the cause of voiding. It is clear from this analysis, that a certain method allowing lateral etch component to be introduced in situ during conventional HDP-CVD etch will help to improve film step coverage due to the etch of deposited and re-deposited oxide species on the top of structures. This is shown in FIG. 7 using the same definition as used in the prior art process scheme in FIG. 1. In addition, gas-phase isotropic etch species 401 and gap-phase isotropic etch products 402 are shown in FIG. 7. As a result, an improvement of deposition will lead to an improvement of gap-fill capability of the deposition process as shown by 305 in FIG. 7.

In this invention, in order to introduce a lateral etch component into conventional HDP-CVD, an approach with special gas additives is proposed. These additives provide the necessary isotropic etch and allow an improvement of film step coverage during deposition due to a lateral etch of the growing film, preferably on the top of structures and, therefore, rounding of growing film profile and voiding elimination.

The halides-contained inorganic compounds are proposed as additives for HDP-CVD deposition processes. Among them: fluorine compounds such as $SF_6$, $HF$, $F_2$, chlorine compounds such as $ClF_3$, $HCl$, $Cl_2$, $SiCl_4$, and bromine compounds such as $HBr$ and $Br_2$. Finally, the summary of important parameters of the invention's HDP-CVD with additives process is presented in Table 3 below:

TABLE 3

| Parameter | Reason parameter is important |
|---|---|
| Silicon source to additive | A decrease of the ratio of silicon source to additive causes an increase of a concentration of additives, |

TABLE 3-continued

| Parameter | Reason parameter is important |
|---|---|
| mole ratio | which is necessary to enhance lateral (isotropic) etch component in the gas-phase being simultaneous with sputtering (anisotropic) component. It allows the etching of the undesirable bread-loaf type of deposited film on the device steps, the improvement of growing film step coverage and, finally, the improvement of gap-fill capability of the process. |
| Etch to deposition (E/D) ratio | The increase of E/D ratio leads to the increase of re-sputtering on device steps and, therefore, leads to worsening of step coverage on the top of step and, eventually, leads to worsening of gap-fill capability. |
| Pressure | Lowering of the pressure allows achieving better film step coverage on device steps and an improvement of film integrity on the steps. |

D. Differentiation of the Invention Over the Prior Art HDP-CVD Processes

The Table 4 below compares parameters for undoped silicon oxide in the invention's process with the prior art HDP-CVD process and clearly shows the difference between the invention and the prior art processes. Both processes use the same HDP-CVD reaction chamber type.

As Table 4 shows, the most important parameters for the invention are: ratio of silicon source to additive, etch to deposition ratio, and process pressure. It should be recognized that many publications describe the details of common techniques used in the fabrication process of integrated components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data is set forth based upon current technology. Future developments in the art may call for appropriate adjustments as would be obvious to one skilled in the art. Also, the conductive lines in the FIGS. can represent any stepped structure on a semiconductor device and are not limited in composition.

TABLE 4

Invention's HDP-CVD with additives

| Process parameter | Estimated range of parameters | preferred range of parameters | Most Prior art HDP-CVD |
|---|---|---|---|
| Wafer temperature (° C.) | 250–650 | 400–450 | 400–650 |
| Pressure (millitorr) | 0.5–10 | 1–5 | <5 |
| Plasma frequency (KHz) | 300–600 | 400–450 | 400–450 |
| Plasma density (W/cm$^3$) | 1 × E11–1 × E13 | 1 × E11–1 × E12 | 1 × E12–1 × E13 |
| Anisotropic etch to deposition (E/D) ratio | 0.03–0.3 | 0.05–0.15 | 0.15–0.3 |
| Silicon source | Silane Inorhanic silane derivatives Organic silane derivatives | Silane Methylsilanes | Silane |
| Silicon source flow (sccm) | 50–500 | 100–200 | 100–200 |
| Oxygen flow rate (sccm) | 100–400 | 250–350 | 250–350 |

TABLE 4-continued

Invention's HDP-CVD with additives

| Process parameter | Estimated range of parameters | preferred range of parameters | Most Prior art HDP-CVD |
|---|---|---|---|
| Depant compounds | Diborane and its derivatives Phosphine and its derivatrives Fluorinated silane derivatives | Diborane and its derivatives Phosphine and its derivatrives Fluorinated silane derivatives | Phosphine and its derivatrives Fluorinated silane derivatives |
| Carrier gas | Ar, He | Ar, He | Ar, He |
| Carrier gas flow (sccm) | 20–400 | 50–100 | 50–100 |
| Gas additives: | | | |
| fluorine compounds | SF$_6$, HF, F$_2$ | SF$_6$, HF | NA |
| chlorine compounds | ClF$_3$, HCl, Cl$_2$, SiCl$_4$ | ClF$_3$, Cl$_2$ | |
| bromine compounds | HBr, Br$_2$ | HBr | |
| Silicon/additive source mole ratio: | 0.5–50 | 3–20 | NA |

While the invention has been particularly shown and described with reference to the preferred embodiments thereof, it will be understood by those skilled in the art that various changes in form and details may be made without departing from the spirit and scope of the invention.

What is claimed is:

1. A method of forming a silicon oxide film over a heated substrate by High Density Plasma Chemical Vapor Deposition (HDP-CVD) using a silicon source and an oxygen source as essential reactants in the constant presence of a plasma, the method comprising the steps of:
    a) placing a substrate in a reaction chamber wherein said substrate has an upper surface having a plurality of steps; and
    b) in a HDP-CVD deposition step, inducing a reaction in a gaseous mixture composition to produce deposition of a silicon oxide film over said substrate wherein said silicon oxide film is deposited by subjecting said substrate to a plasma during the entire said deposition step, and wherein said composition comprises said silicon source, said oxygen source, a carrier gas and a halide-containing inorganic gas additive, wherein said halide-containing inorganic gas additive provides a lateral etch component to said deposition step wherein after said deposition of said silicon oxide film, worsening of film integrity and voids in said film between said steps are avoided.

2. The method according to claim 1 wherein said reaction occurs under the following conditions: a temperature of said substrate is between about 250° C. and 650° C., a process pressure is between 0.5 and 10 millitorr, frequency of energy of said reaction chamber to produce said plasma is between about 300 KHz and 600 KHz, said plasma has a plasma density in the range of between about 1×E11 and 1×E13 ion/cm$^3$, said silicon source is silane with a flow between 50 and 500 mgm, said oxygen source has a flow rate of between 100 and 400 sccm, said carrier gas has a flow of between 20 and 400 sccm, and said gas additive comprises one or more of the group containing: SF$_6$, HF, F$_2$, ClF$_3$, HCl, Cl$_2$, SiCl$_4$, HBr, and Br$_2$ with silane to additive mole ratio of between 0.5 and 50.

3. The method according to claim 1 wherein said reaction occurs under the following conditions: a temperature of said substrate is between about 400° C. and 650° C., a process pressure is between 1 and 5 millitorr, a frequency of energy of reaction chamber to produce said plasma is between about 400 KHz and 450 KHz, said plasma has a plasma density in the range of between about 1×E11 and 1×E12 ion/cm$^3$, said silicon source is silane with a flow between 100 and 200 mgm, said oxygen source has a flow rate between 250 and 350 sccm, said carrier gas has a flow between 50 and 100 sccm, and said gas additive comprises one or more of the group containing: $SF_6$, HF, $ClF_3$, $Cl_2$, and HBr, with silane to additive mole ratio of between 3 and 20.

4. The method according to claim 1 wherein said source of silicon is an inorganic silane derivative.

5. The method according to claim 1 wherein said reaction occurs under the following conditions: a temperature of said substrate is between about 250° C. and 650° C., a process pressure is between 0.5 and 10 millitorr, frequency of energy of reaction chamber to produce said plasma is between about 300 KHz and 600 KHz, said plasma has a plasma density in the range of between about 1×E11 and 1×E13 ion/cm$^3$, said silicon source is inorganic silane derivatives with a flow between 50 and 500 mgm, said oxygen source has a flow rate of between 100 and 400 sccm, said carrier gas has a flow of between 20 and 400 sccm, and said gas additive comprises one or more of the group containing: $SF_6$, HF, $F_2$, $ClF_3$, HCl, $Cl_2$, $SiCl_4$, HBr, and $Br_2$ with silane to additive mole ratio of between 0.5 and 50.

6. The method according to claim 1 wherein said source of silicon is an organic silane derivative.

7. The method according to claim 1 wherein said reaction occurs under the following conditions: a temperature of said substrate is between about 250° C. and 650° C., a process pressure is between 0.5 and 10 millitorr, frequency of energy of reaction chamber to produce said plasma is between about 300 KHz and 600 KHz, said plasma has a plasma density in the range of between about 1×E11 and 1×E13 ion/cm$^3$, said silicon source is organic silane derivatives with a flow between 50 and 500 mgm, said oxygen source has a flow rate of between 100 and 400 sccm, said carrier gas has a flow of between 20 and 400 sccm, and said gas additive comprises one or more of the group containing: $SF_6$, HF, $F_2$, $ClF_3$, HCl, $Cl_2$, $SiCl_4$, HBr, and $Br_2$ with silane to additive mole ratio of between 0.5 and 50.

8. The method according to claim 1 wherein said composition further comprises a source of boron and said silicon oxide film is doped with said boron.

9. The method according to claim 1 wherein said composition further comprises a source of phosphorus and said silicon oxide film is doped with said phosphorus.

10. The method according to claim 1 wherein said composition further comprises a source of boron and a source of phosphorus and said silicon oxide film is doped with said boron and said phosphorus.

11. The method according to claim 1 wherein said composition further comprises a source of fluorine and said silicon oxide film is doped with said fluorine.

12. A method of forming a silicon oxide film over a heated substrate by High Density Plasma Chemical Vapor Deposition (HDP-CVD) using a silicon source and an oxygen source as essential reactants in the constant presence of a plasma; the method comprising the steps of:

a) placing a substrate in a reaction chamber wherein said substrate has an upper surface having a plurality of steps;

b) in a HDP-CVD deposition step, inducing a reaction in a gaseous mixture composition to produce deposition of a silicon oxide film over said substrate wherein said silicon oxide film is deposited by subjecting said substrate to a plasma during the entire said deposition step, and wherein said composition comprises said silicon source, said oxygen source, a carrier gas, sources of boron, phosphorus, and fluorine as doping compounds, and a halide-containing inorganic gas additive, wherein said halide-containing inorganic gas additive provides a lateral etch component to said deposition step wherein after said deposition of said silicon oxide film, worsening of film integrity and voids in said film between said steps are avoided.

13. The method according to claim 12 wherein said reaction occurs under the following conditions: a temperature of said substrate is between about 250° C. and 650° C., a process pressure is between 0.5 and 10 millitorr, frequency of energy in said reaction chamber to produce said plasma is between about 300 KHz and 600 KHz, said plasma has a plasma density in the range of between about 1×E11 and 1×E13 ion/cm$^3$, said silicon source is silane with a flow between 50 and 500 mgm, said oxygen source has a flow rate between 100 and 400 sccm, said carrier gas has a flow between 20 and 400 sccm, said sources of boron and phosphorus are diborane and phosphine or their derivatives, said source of fluorine is a fluorinated derivative of silane, said gas additive comprises one or more of the group containing: $SF_6$, HF, $F_2$, $ClF_3$, HCl, $Cl_2$, $SiCl_4$, HBr, and $Br_2$ with silane to additive mole ratio of between 0.5 and 50.

14. The method of claim 12 wherein said reaction occurs under the following conditions: a temperature of said substrate is between about 400° C. and 650° C., a process pressure is between 1 and 5 millitorr, a frequency of energy of reaction chamber to produce said plasma is between about 400 KHz and 450 KHz, said plasma has a plasma density in the range of between about 1×E11 and 1×E12 ion/cm$^3$, said silicon source is silane with a flow of between 100 and 200 mgm, said oxygen source has a flow of between 250 and 350 sccm, said carrier gas has a flow of between 50 and 100 sccm, said sources of boron and phosphorus are diborane and phosphone or their derivatives, said source of fluorine is a fluorinated derivative of silane, and said gas additive comprises one or more of the group containing: $SF_6$, HF, $ClF_3$, $Cl_2$, and HBr with silane to additive mole ratio of between 3 and 20.

15. A method of forming a silicon oxide film over a heated substrate by High Density Plasma Chemical Vapor Deposition (HDP-CVD) using a silicon source and an oxygen source as essential reactants in the constant presence of a plasma; the method comprising the steps of:

a) placing a substrate in a reaction chamber wherein said substrate has an upper surface having a plurality of steps;

b) in a HDP-CVD deposition step, inducing a reaction in a gaseous mixture composition to produce deposition of a silicon oxide film over said substrate wherein said silicon oxide film is deposited by subjecting said substrate to a plasma during the entire said deposition step, and wherein said composition comprises said silicon source, said oxygen source, a carrier gas, sources of boron, phosphorus, or fluorine as doping compounds, and a halide-containing inorganic gas additive, wherein said halide-containing inorganic gas additive comprises one or more selected from the group consisting of: $SF_6$, HF, $F_2$, $ClF_3$, HCl, $Cl_2$, $SiCl_4$, HBr, and $Br_2$ and wherein said halide-containing inorganic gas additive provides a lateral etch component to said deposition step wherein after said deposition of said silicon oxide film, worsening of film integrity and voids in said film between said steps are avoided.

16. The method according to claim 15 wherein said reaction occurs under the following conditions: a temperature of said substrate is between about 250° C. and 650° C., a process pressure is between 0.5 and 10 millitorr, frequency of energy in said reaction chamber to produce said plasma is between about 300 KHz and 600 KHz, said plasma has a plasma density in the range of between about 1×E11 and 1×E13 ion/cm$^3$, said silicon source is silane with a flow between 50 and 500 mgm, said oxygen source has a flow rate between 100 and 400 sccm, said carrier gas has a flow between 20 and 400 sccm, said sources of boron and phosphorus are diborane and phosphine or their derivatives, said source of fluorine is a fluorinated derivative of silane, and a silane to gas additive mole ratio of between 0.5 and 50.

17. The method of claim 15 wherein said reaction occurs under the following conditions: a temperature of said substrate is between about 400° C. and 650° C., a process pressure is between 1 and 5 millitorr, a frequency of energy of reaction chamber to produce said plasma is between about 400 KHz and 450 KHz, said plasma has a plasma density in the range of between about 1×E11 and 1×E12 ion/cm$^3$, said silicon source is silane with a flow of between 100 and 200 mgm, said oxygen source has a flow of between 250 and 350 sccm, said carrier gas has a flow of between 50 and 100 sccm, said sources of boron and phosphorus are diborane and phosphone or their derivatives, said source of fluorine is a fluorinated derivative of silane, and a silane to additive mole ratio of between 3 and 20.

* * * * *

UNITED STATES PATENT AND TRADEMARK OFFICE
CERTIFICATE OF CORRECTION

PATENT NO.    : 6,355,581 B1
DATED         : March 12, 2002
INVENTOR(S)   : Vladislav Vassiliev, John Leonard Sudijono, Yelehanka Ramachandramurthy Pradeep and Jie Yu It is certified that error appears in the above-identified patent and that said Letters Patent is hereby corrected as shown below:

<u>Title page</u>,
Item [74], delete " Rosemary L. S. Pik" and replace with -- Rosemary L. S. Pike --.

Signed and Sealed this

Eleventh Day of June, 2002

Attest:

JAMES E. ROGAN
Attesting Officer    Director of the United States Patent and Trademark Office